United States Patent [19]

Casey

[11] Patent Number: 4,692,233

[45] Date of Patent: Sep. 8, 1987

[54] VACUUM COATING APPARATUS

[75] Inventor: Frank Casey, Rochdale, England

[73] Assignee: General Engineering Radcliffe Limited, Radcliffe, England

[21] Appl. No.: 597,123

[22] Filed: Apr. 5, 1984

[30] Foreign Application Priority Data

Apr. 6, 1983 [GB] United Kingdom ............... 8309324
Sep. 9, 1983 [GB] United Kingdom ............... 8324192

[51] Int. Cl.⁴ ..................... C23C 14/56; C23C 14/36
[52] U.S. Cl. ........................... 204/298; 204/192.12; 118/718; 118/719
[58] Field of Search ................ 204/298, 192 R; 118/718, 719, 50, 50.1

[56] References Cited

U.S. PATENT DOCUMENTS

| | | | |
|---|---|---|---|
| 3,123,493 | 3/1964 | Brick | 118/718 X |
| 4,014,779 | 3/1977 | Kuehnle | 204/298 |
| 4,204,942 | 5/1980 | Chahroupi | 204/298 |
| 4,261,808 | 4/1981 | Walter | 204/298 |
| 4,313,815 | 2/1982 | Graves, Jr. et al. | 204/298 |
| 4,322,276 | 3/1982 | Meckel et al. | 204/192 P |
| 4,492,181 | 1/1985 | Ovshinsky et al. | 118/718 |

Primary Examiner—John F. Niebling
Assistant Examiner—William T. Leader
Attorney, Agent, or Firm—Fleit, Jacobson, Cohn & Price

[57] ABSTRACT

A vacuum metallizer comprises a vacuum chamber split into a number of sub-chambers by partitions. A material transport mechanism is disposed in one sub-chamber and metallizing sources in the others. Sub-chambers are individually pumped to provide close control of sub-chamber pressures. Sources are activated and when the length of material is drawn past them the metal of the sources is deposited thereon. Each partition comprises two sealed parts, one of which moves with the web transport mechanism while the other remains in the vacuum chamber when the chamber is opened. This enables a close gap to be maintained between partitions and mechanism which in turn restricts gas leakage between adjacent sub-chambers.

7 Claims, 6 Drawing Figures

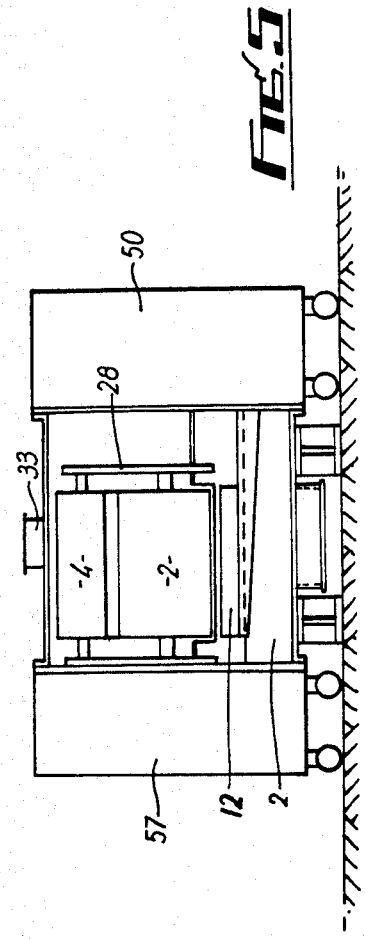
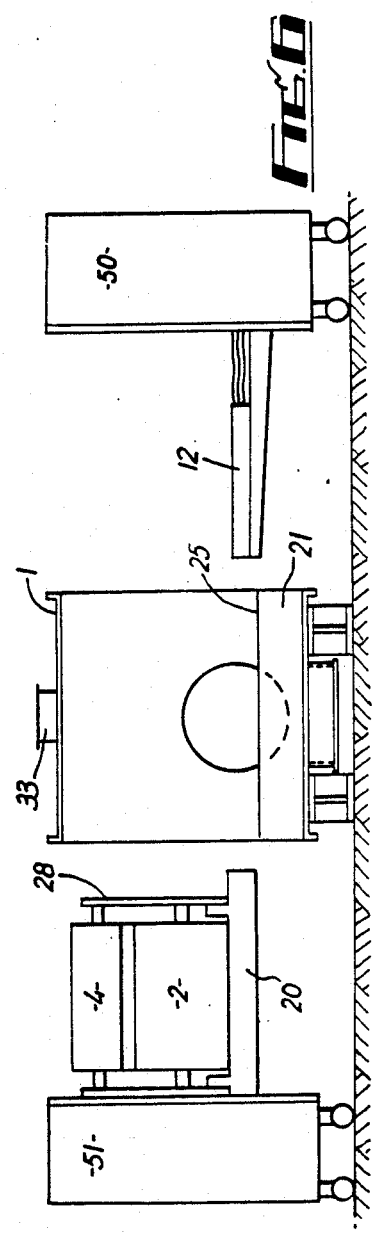

VACUUM COATING APPARATUS

The present invention relates to vacuum coating apparatus.

Apparatus of this broad general type is known. In one form of this apparatus, a flexible web of a material to be coated is transported past a source of a metal in a vacuum. As the material passes the metal source, the metal is sputtered onto the material to metallize it. Sputtering normally takes place in an inert gas atmosphere in which a plasma is produced. Ions in the plasma are accelerated towards the sputtering target by means of an electric field set up between an anode and a cathode. On striking the target, the ions cause atoms of the metal of the target to be ejected. These ejected atoms form the surface of the target travel to the material and coat it. Magnets associated with the target confine the plasma electrons to the region near the target giving them long spiralling paths about the field lines and increasing the number of ionising collisions per electron. By using inert gas, target metal may be deposited on the material in relatively pure form, since the gas does not react with the metal. However, reaction may under some circumstances be beneficial and under these circumstances the inert gas is "doped" with another gas, for example an oxide of the metal may be obtained by supplying oxygen. The gas or gasses may be supplied direct to the target. Gaseous by products from the process are continuously pumped out from the chamber to maintain the level of vacuum in it.

More than one coating may be sequentially deposited on the material web and these layers may be of different substances. Particularly where the substances of these layers are different it may be necessary to isolate the deposition of one layer from the deposition of the next so that one does not contaminate another. One arrangement of apparatus for securing this end is described in U.S. Pat. No. 4,204,942. However, in this arrangement, the provision of an enclosure within the evacuable chamber for each substance to be deposited on the material web is difficult in practice to construct and put into operation and difficult and expensive to maintain.

According to one aspect of the present invention, there is provided a vacuum coating apparatus comprising a housing defining a vacuum chamber, partition means for dividing the chamber into at least three sub-chambers, at least two treatment stations disposed in two respective sub-chambers, means for transporting a length of material past the stations and means for activating the stations so as to sequentially treat the length of material as it passes the stations, one of the stations comprising a source of coating substance which when activated coats the length of material.

In a preferred embodiment of the invention, three sources in respective sub-chambers are provided in the lower half of the chamber. Each sub-chamber is individually pumped by a respective vacuum pump and each treatment station has its own gas, coolant and power supply. Each partition between adjacent sub-chambers and the upper half of the chamber has two parts, one connected to the support for the means for transporting and the other to the interior wall of the housing. The means for transporting comprises a cylinder to which the length of material to be processed is fed from a supply reel and from which the length is fed to a take up reel. The power supply is employed to create an electric field at the respective source to accelerate ions of the gas towards a target plate of the substance of the source to be deposited to displace atoms of that substance from the plate. These atoms travel from the surface of the target to the material and coat it.

According to another aspect of the invention there is provided a method of coating a length of material in a vacuum chamber with at least one layer of deposited substance including the step of supplying gas to two treatment stations in respective sub-chambers of the main chamber, activating the stations, drawing the length of material past the treatment stations to allow the material to be treated, pumping the gaseous products of the process from respective sub-chambers and maintaining the pressure in those sub-chambers at a value less than that of the rest of the vacuum chamber, at least one of the two treatment stations being a source of coating material which is deposited on the length of material on activation of the source.

In order that the invention may be more clearly understood, one embodiment thereof will now be described, by way of example, with reference to the accompanying drawings, in which:

FIG. 5 is a side elevational view of the apparatus of FIGS. 1 and 2 with the vacuum chamber shown in the operational closed position; and FIG. 6 is a side elevational view of the apparatus of FIGS. 1 and 2 with the vacuum chamber shown in the open position.

Figure 1:
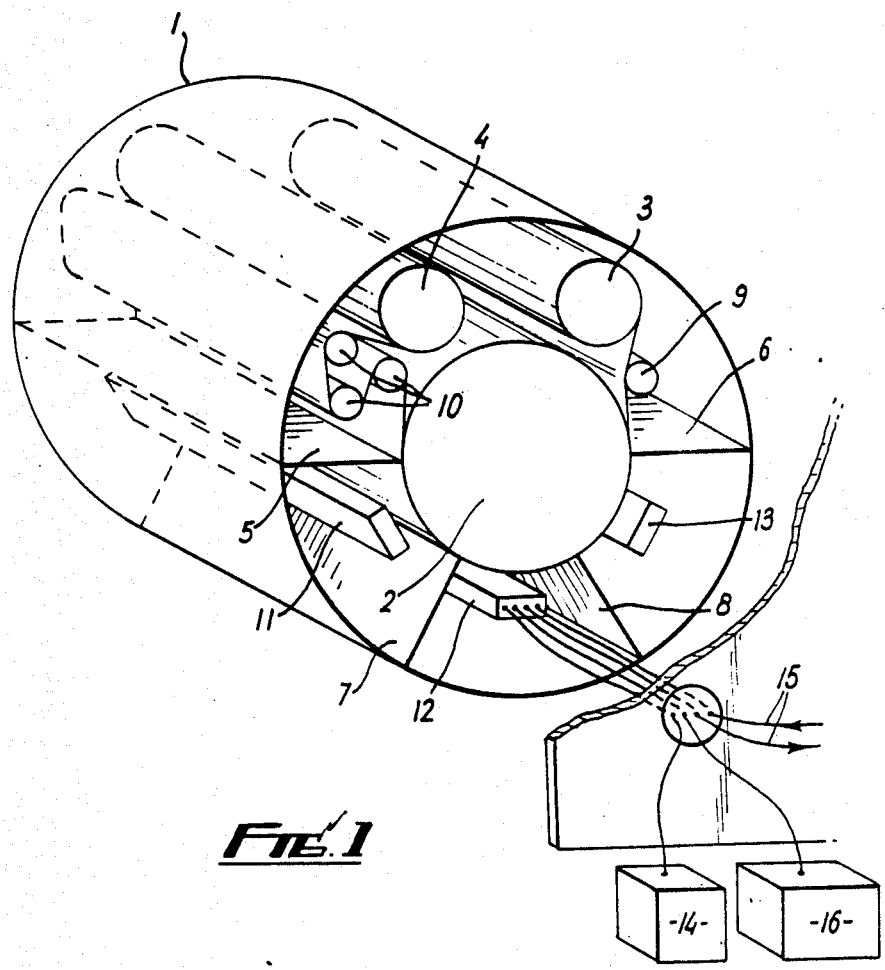
FIG. 1 is a partial perspective view of one form of vacuum coating apparatus according to the invention.

Referring to FIG. 1, the apparatus comprises a housing 1 defining a cylindrical vacuum chamber. Disposed with this vacuum chamber is a cylindrical support or working roll 2. This roll is disposed centrally within and coaxial with the vacuum chamber. A supply or feed roll 3 is disposed to one side of the working roll 2 and a take-up roll 4 is disposed on the other side of the roll 2. Various guide rolls 9 and 10 are shown between the roll 2 and the rolls 3 and 4.

The vacuum chamber is split into four sub-chambers by means of four radially extending partitions 5 to 8. Partitions 5 and 6 effectively divide the vacuum chamber in half and partitions 7 and 8 split the lower half of the chamber into three. The supply and take up rolls 3 and 4, guide rolls 9 and 10 and upper half of the working roll 2 are disposed in the upper half of the vacuum chamber. Three metallising sources 11, 12 and 13 are respectively disposed in the three sub-chambers formed between the partitions 5 to 8 of the lower half of the vacuum chamber. Each of these sources is provided with its own gas, coolant (usually water) and electric power supply respectively referenced 14, 15 and 16. For simplicity only the supplies to source 12 have been illustrated. As can be seen from FIG. 1, these supplies are led in axially to the respective sources 14, 15 and 16 through appropriate respective terminal points in the axial end wall of the housing 1. This mode of connection for these supplies facilitates the opening and closing of the apparatus as compared, for example, with bringing these supplies in from the bottom of the chamber as will be described in more detail later.

Figure 2:
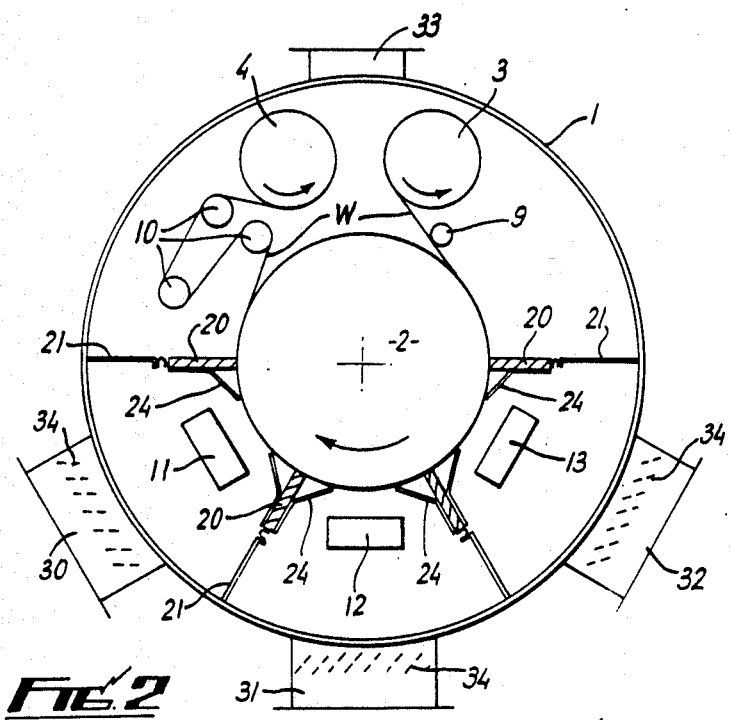
FIG. 2 is an elevational view of the apparatus of FIG. 1 in cross section.
Figure 3:
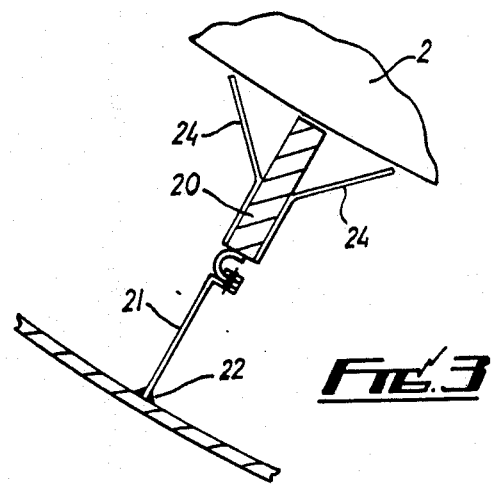
FIG. 3 is a detail view of a part of the apparatus of FIGS. 1 and 2.

Referring to FIGS. 2 and 3, each partition 5 to 8 comprises two parts 20 and 21. Parts 20 are supported via a frame 28 (see FIGS. 5 and 6) from the shaft on which roll 2 is supported and move axially with roll 2. Parts 21 are welded by welds 22 (see FIG. 3) to the interior surface of the housing 1 defining the vacuum chamber. Each pair of parts 20 and 21 are sealingly, axially slidable with respect to one another. To this end a rubber or neoprene seal 25 of 'C' shaped cross section is connected to part 21 by means of a nut 23. The free end of this seal slides sealingly on the outer radial edge of the corresponding part 20. Alongside each part 20 are disposed one or two copper sheet baffles 24. These baffles define the area of flexible material web W which is exposed to the material from the corresponding source. They also reduce the tendency of any gas transfer as between adjacent sub-chambers. The spaces between the radially inner edge of these baffles 24 and the surface of the web is $\frac{1}{8}$ inch and the spacing between the radially inner edge of the parts 20 and the surfaces of the web is about $12 \times 10_{-3}$ inches. This small spacing between the parts 20 and the web W reduces leakage of gas as between adjacent sub-chambers.

Each of the three sub-chambers respectively housing the three sources 11, 12 and 13 is pumped via respective exits the wall of the chamber by its own individual vacuum pump 30, 31 and 32. These pumps are appropriately located on the external surface of the housing 1 at positions adjacent their corresponding sub-chambers. A vacuum pump 33 is also provided on the external surface of the housing 1 for pumping out the upper half of the vacuum chamber via an exit located in the wall of that part of the chamber. Each of the pumps 31 to 33 contains a baffle 34 which, by appropriate adjustment, can be employed to control the degree of vacuum in the respective sub-chambers of the vacuum chamber.

Figure 4:
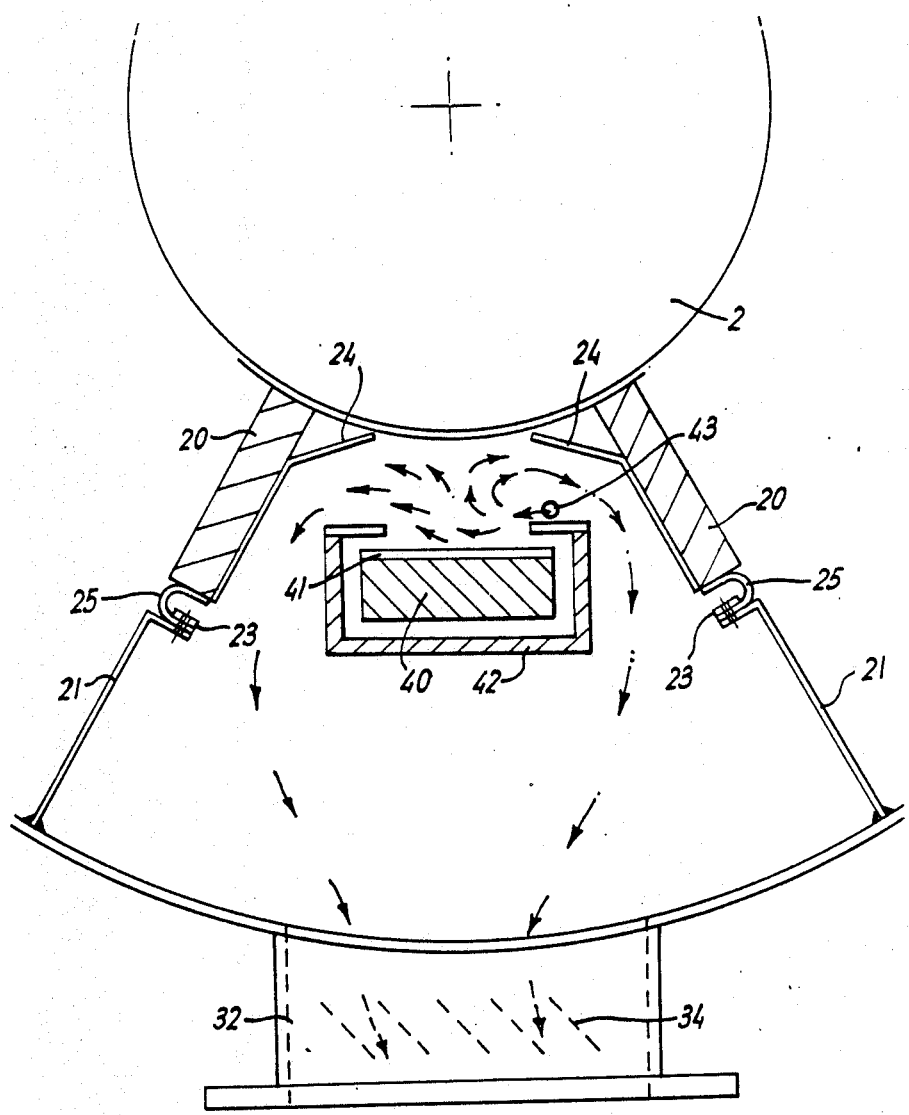
FIG. 4 is a further detail view of part of the apparatus of FIGS. 1 and 2 on enlarged scale.

Referring to FIG. 4 each source comprises a cathode 40, which supports a target plate 41 of the metal to be sputtered on the web W, and an anode 42 which surrounds and acts as a housing for the cathode. A gas inlet 43 is positioned above the target plate 41. Only source 12 is shown in FIG. 4, but the other two sources 11 and 13 are of similar construction.

In operation of the above described apparatus, the chamber is evacuated, an electric field is set up across the anode and the cathode of each source via the power supply 16 to respective sources, and coolant and gas is supplied to respective sources. The web W is fed at a predetermined rate from the roll 3 over the roll 2 to the take-up roll 4. A plasma is created above each source and the charged ions of the plasmas are accelerated towards respective target plates 41 by respective electric fields. Permanent magnets (not shown) confine and form the ion streams onto the desired areas of the target plates. The impinging gas ions impart this energy to the atoms of the material of the respective target plates 41 and those atoms are ejected from their respective plates and travel to and coat the web W as it passes the respective sources. The gaseous products of the process are continuously pumped out of the sub-chambers in which the sources 11, 12 and 13 are disposed by respective pumps 30, 31 and 32 to maintain the vacuum in these sub-chambers. Vacuum is also maintained in upper half of the chamber by means of the pump 33. Control of the gas supply rates and of the pumps 30 to 33 enable considerable control of the pressures in the vacuum chambers. The pressure in the sub-chamber housing the sources 11, 12 and 13 is less than the pressure in the upper half of the chamber.

Referring to FIGS. 5 and 6, when it is desired to open the vacuum chamber, for maintenance for example, the sources 11, 12 and 13, which are connected to one trolley 50 are withdrawn from the housing 1 to the right and the web W winding mechanism comprising the feed, take up, guide and working rolls 2, 3, 4, 9 and 10 which are connected to a second trolley 51, are withdrawn to the left. This separation of the sources 11, 12 and 13 from the remainder of the apparatus exposes them immediately for inspection, maintenance and replenishments with a consequent saving in labour, apparatus downtime and expense. Furthermore, because the sources are fed with gas, coolant and power axially no disconnection of services is necessary as is the case when the sources are fed with these supplies through the base of the apparatus. The ready accessibility to the sources facilitates removal and/or cleaning of the target. The disposition of the partitions 20 and 21 and the provision of the associated baffles 24 facilitates the setting of the gap between the partitions and the roll 2 (parts 20 and the roll 2 are connected together). The baffles also enable the deposition of metals on the web to be substantially vertical. This columnar growth has distinct advantages in certain applications, the production of recording tape for example, since the pumps are disposed extendingly of the chamber, they can be inspected and maintained without opening the chamber.

It will be appreciated that the above embodiment has been described by way of example only, and many variations are possible without departing from the scope of the invention. For example, more than one source per sub-chamber may be provided if desired. Furthermore, if coating on both sides of the web were required, the arrangement would be duplicated within the vacuum chamber one side of the web being coated on a pass over a first working roll and the other one being coated on a pass over a second working roll, each roll having associated with it an appropriate number of sub-chambers.

Although in the above described embodiment, all the treatment stations are metallising sources one or more of them could be stations of other types such as, for example, cleaning units in the form of glow discharge units. Such a unit would have its own gas coolant and power supply. Also, the gas inlet to each source could lead into the lower part of the cathode rather than above the target plate.

What I claim is:

1. A vacuum coating apparatus for coating a length of sheet material comprising: a housing defining a vacuum chamber and having an interior wall and an axis; a transport cylinder having a central axis positioned within said housing; a plurality of radially extending peripherally spaced partitions dividing the chamber into at least three sub-chambers; each partition having a first part closely spaced from the transport cylinder and being in a fixed relationship to the position of the transport cylinder, a second part radially spaced from the first part, fixed to the interior wall and adapted to slide relative to the first part in the direction of the central axis of the transport cylinder, and sealing means interposed between the two partition parts; at least two treatment stations disposed in two respective sub-chambers; transporting means within the housing cooperating with the transport cylinder to transport a length of material past the treatment stations, said transport cylinder including a transport surface over which the sheet material passes, the transport surface defining at least one inner wall of each of said sub-chambers; and means for activating the treatment stations to treat sequentially the length of material as it passes the respective stations, one of the stations comprising a source of a coating substance which when activated coats the length of material as it passes that station.

2. A vacuum coating apparatus as claimed in claim 1, in which each sub-chamber has a respective vacuum pump by means of which it is individually pumped.

3. A vacuum coating apparatus as claimed in claim 1, in which each treatment station has its own gas, coolant and power supply.

4. A vacuum coating apparatus as claimed in claim 3, in which the power supply of each treatment station is employed to create an electric field to accelerate ions of gas towards a target plate of a substance to be deposited on the sheet material to displace atoms of that substance from the plate toward the sheet material.

5. A vacuum coating apparatus as claimed in claim 1, in which the sealing means is rubber or neoprene and of 'C' shaped cross section.

6. A vacuum coating apparatus as claimed in claim 1, in which the transporting means include sheet supply means and sheet take-up means, each of which is disposed in an upper part of the vacuum chamber and the treatment stations are disposed in a lower part of the vacuum chamber.

7. A vacuum coating apparatus as claimed in claim 1, in which the transporting means include a supply reel and a take-up reel, and the transport cylinder to which the length of material to be processed is fed from the supply reel and from which the length of material is fed to the take-up reel.

* * * * *